United States Patent [19]

Filipescu

[11] Patent Number: 5,457,392
[45] Date of Patent: Oct. 10, 1995

[54] TESTING CLIP AND CIRCUIT BOARD CONTACTING METHOD

[76] Inventor: Radu Filipescu, Piata Al.Sahia 3, et. 2, cod 70203, Bucharest, Romania

[21] Appl. No.: 75,575

[22] PCT Filed: Dec. 19, 1991

[86] PCT No.: PCT/RO91/00003

§ 371 Date: Jun. 14, 1993

§ 102(e) Date: Jun. 14, 1993

[87] PCT Pub. No.: WO92/11539

PCT Pub. Date: Jul. 9, 1992

[30] Foreign Application Priority Data

Dec. 20, 1990 [RO] Romania .................................. 146.608
Aug. 15, 1991 [RO] Romania .................................. 148.260

[51] Int. Cl.[6] .................................................. G01R 31/02
[52] U.S. Cl. ........................... 324/555; 324/543; 324/757; 324/149
[58] Field of Search ..................................... 324/500, 543, 324/555, 149, 158 P, 72.5, 754, 757

[56] References Cited

U.S. PATENT DOCUMENTS

| 634,862 | 10/1899 | Baggett | 324/556 |
|---|---|---|---|
| 2,292,236 | 8/1942 | Martin | 324/555 X |
| 2,445,667 | 7/1948 | Fuglie | 324/555 |
| 2,516,657 | 7/1950 | Spendlove | 173/273 |
| 2,529,270 | 11/1950 | Webster | 324/555 X |
| 2,769,155 | 10/1956 | Wimble | 439/219 |
| 3,022,483 | 2/1962 | Youger | 439/729 |
| 3,271,673 | 9/1966 | Woroble | 324/72.5 |
| 3,363,171 | 1/1968 | Sietmann et al. | 324/72.5 |
| 3,768,005 | 10/1973 | Louks | 324/555 |
| 3,893,027 | 7/1975 | Veenendaal | 324/72.5 |
| 4,716,365 | 12/1987 | Pool | 324/158 P |

FOREIGN PATENT DOCUMENTS 268449 2/1969 Australia .
822413 10/1951 Germany .

Primary Examiner—Kenneth A. Wieder
Assistant Examiner—Glenn W. Brown
Attorney, Agent, or Firm—Herbert Dubno

[57] ABSTRACT

A testing clip for electrical connections between a wire and points, surfaces or pins, which thus are connected to electric and electronic measuring and testing equipment and generators. The clip has a hand-held unit, a gripping unit and a resilient device providing connections both by direct hand-held pointing and by hitching on, offering good accessibility to narrow places and good insulation between the operator and the signal. The contacts are performed by a tip of the electrically conductive needle, which is a part of the hand-held unit and to which the wire is connected. The gripping rod, attaches the clip to the device to be tested by the hitch on procedure.

6 Claims, 4 Drawing Sheets

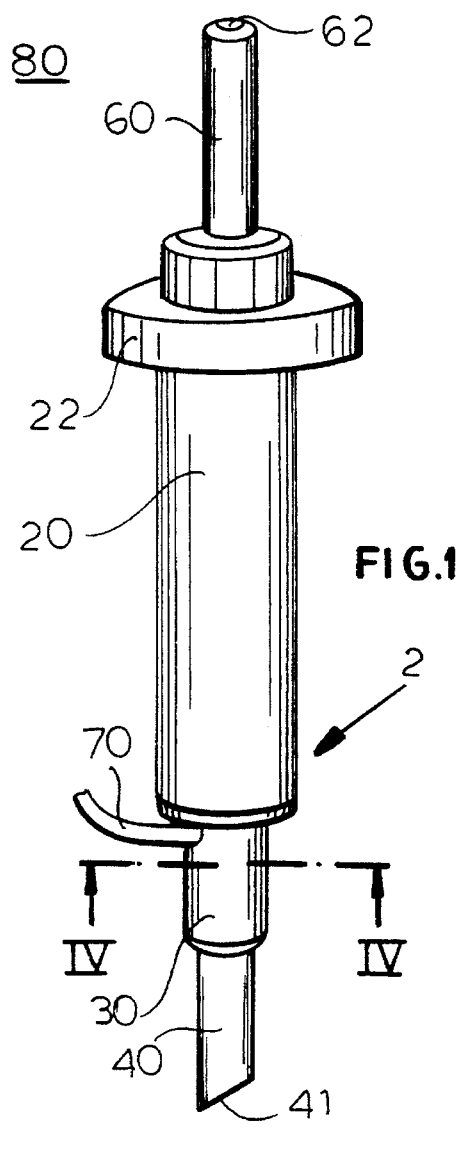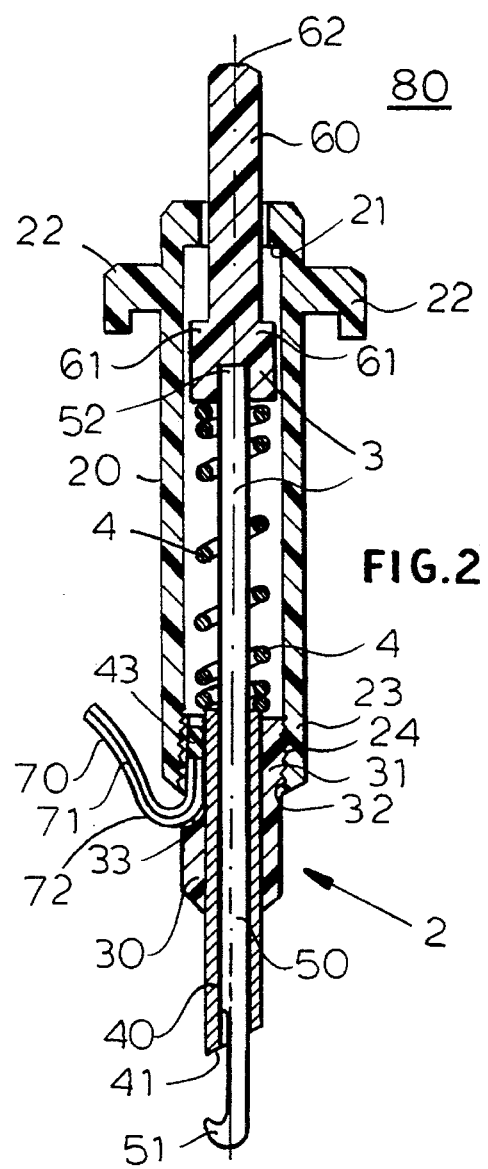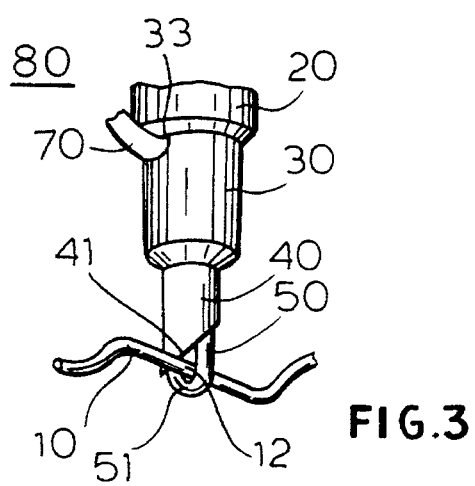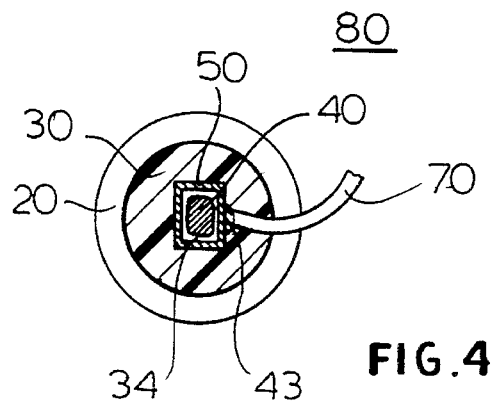

5,457,392

TESTING CLIP AND CIRCUIT BOARD CONTACTING METHOD

CROSS REFERENCE TO RELATED APPLICATION

This application is a national phase of PCT/RO91/00003 filed 19 Dec. 1991 and based, in turn, on a Romanian national application 146,608 filed 20 Dec. 1990 and a Romanian national application 148,260 filed 15 Aug. 1991 under the International Convention.

FIELD OF THE INVENTION

The present invention relates to a testing clip for providing the electrical connections of a connecting wire to points to be contacted and tested. More particularly this invention relates to a device for making connections between points, conductive surfaces or pins and electric and electronic measuring equipment and generators. The invention relates also to a circuit board contacting method, providing electrical connections of testing clips to circuit boards.

BACKGROUND OF THE INVENTION

Known testing probes can include probes which have an electrically conductive metallic needle, included in an insulated body of the probe and connected to a connecting wire. This probe has no gripping possibilities to perform hitch on connections to test points and the operator-signal insulation may not be sufficient, as it depends on the thickness of the body.

Probes can also have a hollow sleeve body receiving a mobile rod. The mobile rod is connected to the connecting wire, has a hooked end, is electrically conductive and acts as the testing contact. This probe has hitching on capability, but is disadvantageous because the direct point-contact is unwieldy and tiring, requiring continuous pressure on the button. Also the insulation between the operator and the signal may not be sufficient.

Alligator clips can be used which comprise two conductive jaws rotating on a pivot and compressed by a spring. One of the jaws is connected to the connecting wire. The alligator clip has gripping possibilities, but poor direct pointing contact performance, especially in narrow places, and also very poor insulation between the operator and the electrical signal.

Existing probes do not offer good testing performance in both contact modes, i.e. direct point contact and hitching on. Moreover the probes do not offer very good operator-signal insulation and do not enable hitch on, hands free connections on the circuit boards.

OBJECTS OF THE INVENTION

The object of this invention is to provide a testing clip which achieves good performance, and has low contact resistance in the two testing modes, namely direct pointing and hitching on. The clip should provide reliable contact on points, surfaces, pins, wires, and electronic devices even in narrow places. The clip also should provide very good operator-signal insulation. In the hitch-on connection, the clip should have only low stress on the contacting parts. The clip should also provide hitch-on opportunities on electronic circuit boards on the edges of the holes performed in the board. Connections to one or several points of the circuit should also be available by the circuit board contacting method.

SUMMARY OF THE INVENTION

According to the invention, a testing clip is provided, comprising a hand-held unit or handle, a gripping unit, a resilient device and a connecting wire.

The hand-held unit comprises a hollow outer sleeve made of insulating material on one side of which a needle is fixed, preferably by means of a support. The needle is made of an electrically conductive material, such as metal. The outside end of the needle is used to make the electrical contacts to test points, and the inside end is electrically connected to the conductive wire.

The needle can have different shapes. In a preferred embodiment of this invention it is a metal sheath.

In an alternative arrangement the needle is not hollow and has a forked tip while the hooked rod can slide along the needle performing the gripping when necessary. The testing needles are fixed in the support, preferably made of a rigid insulating material, such as plastic. The joint between the support and the sleeve is preferably detached, for instance, by threading.

Preferably, a finger grip is provided on the sleeve to allow the operator to hold the clip with the fingers of only one hand, while forcing the button inwardly with the thumb or the palm of the same hand. This allows easy one-hand operation.

The gripping unit comprises a rod, preferably hooked, and a button. The hooked end of the rod is guided by a guide. The guide is hollow, inside or outside the needle, preferably parallel to the axis of the needle. At the unhooked end of the rod is the button made of insulating material. By pushing the button, the gripping unit assumes the protruding position with the hook of the rod protruding from the hand-held unit. By releasing the button, the resilient device, preferably a metal spring, urges the gripping unit into the retracted position, with the rod retracted into the hand-held unit.

The rod can be made of a conductive material, for example metal, providing good mechanical grip and better electrical contact, or can be made of insulating material for improved accessibility and better prevention of short-circuits.

The wire connected to the needle, emerges, by a canal or passage inside the support or the sleeve. The canal is, preferably, at a short distance from the tip of the needle. This path of the wire creates only a low stress when the clip is hanging on a testing point due to the short distance to the force produced by weight of the wire or by movement of the wire. This path of the wire keeps the electrical signal far from the operator, providing high signal-operator insulation and offers protection to the operator from high voltage signals and low influence on the signal by the operator.

To provide direct point contact, the needle of the clip is placed on the point to be tested, the hook of the rod being retracted. The gripping unit in this retracted position, is pressed by the spring to a limiting shoulder on the hollow outer sleeve.

When the clip is to be hitched on, the button is pressed with a finger, bringing the hook to the protruding position. The hook is hung on the device to be tested, and when the finger is released, the hooked rod draws in, thus gripping the tested device between the hook and the needle. The needle is brought in contact with the desired test point. The gripping unit slides inside the hand-held unit, the hooked rod slides along a guide inside the needle or the support, and the button slides inside the hollow of the sleeve.

An important facility offered by this invention is the possibility of hitching the clip on the edges of circuit boards. To perform connections by the circuit board contacting method, the board is provided with holes. Preferably, the holes have a size and shape to allow the hooked rod to enter. At the withdrawing of the rod, the clip can be hitched on the circuit board.

The test points are the common metallic parts of the circuit arranged near edges. The testing needle is pointed to the desired point on the circuit while the rod clasps the edge of the board.

In another embodiment of the invention, intended to permit multiple connections on circuit boards, two or more needles are fixed onto the support. On one side of the needles the contact is made to the test points and on the other side the wires are connected to the electrical measuring equipment.

Another embodiment of the invention has the ability to provide, by the same procedure, many connections to circuit boards and has a good gripping on the circuit board using two gripping units.

In another embodiment of the invention, where the wire is a coaxial shielded wire, the support has a metal shield on the outer side, connected to the shield of the coaxial wire, to provide best protection for the signal.

BRIEF DESCRIPTION OF THE DRAWING

The above and other objects, features, and advantages will become more readily apparent from the following description, reference being made to the accompanying drawing in which:

FIG. 1 is a perspective view of a preferred embodiment of the present invention with the gripping unit in the retracted position;

FIG. 2 is a view of part of the testing clip gripping and contacting a wire;

FIG. 3 is a view of part of the testing clip gripping and contacting a wire;

FIG. 4 is a cross-sectional view taken along the line IV—IV of FIG. 1;

SPECIFIC DESCRIPTION

Figure 5:
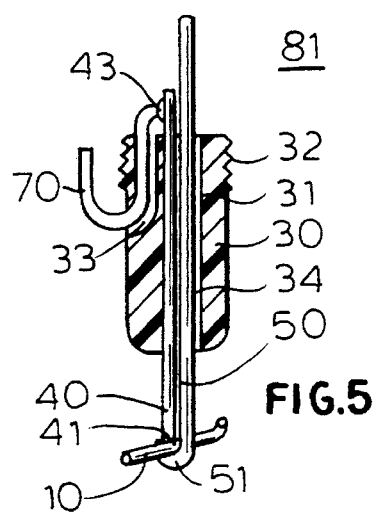
FIG. 5 is a cross-sectional view of another embodiment of the invention with the guide for the rod inside the support, the testing clip gripping a wire between the needle and the hooked rod.

The detailed description set forth below in connection with the appended Figures is intended, merely, as a description of the presently preferred embodiments of the invention, and is not intended to represent the only form in which the present invention may be constructed or utilized.

FIGS. 1 and 2 show a testing clip 80 according to a preferred embodiment of the invention. The clip 80 basically comprises a hand-held unit 2, a gripping unit 3, a resilient device 4 and an insulated wire 70.

The hand-held ensemble 2 comprises a hollow outer sleeve 20, a tubular support 30, and a testing needle 40. The sleeve 20 is made of electrically nonconductive material, such as plastic, and has on one end a sleeve-joint 23, in the preferred embodiment with a thread 24, by which the sleeve-support joint is made.

For limiting the movement of the gripping unit 3, at the other end of the sleeve 20, there is a limiting shoulder 21.

The support 30 is made of electrically nonconductive material, such as plastic, and has on one side the complementary part of the joint, the support-joint 31 in this embodiment with a thread 32. On the support 30 is fixed a testing needle 40, made of conductive material, such as metal. The needle 40 in this embodiment of the invention is a sheath with the hollow acting as a guide 34 for the rod 50. At the outer side of the needle 40 is the tip 41, preferably sharp, to insure good contact on the test points. On the other side of the needle 40, there is an electrical and mechanical connection to the wire 70. In the preferred embodiment of the invention, the wire has an insulation 71 and the connection 43 is made by soldering.

The gripping unit 3 of the testing clip comprises the rod 50 and the button 60, which are mechanically fixed together. The rod 50 has a hook 51 on one end and the other end 52 is attached to the button 60. The rod 50 can slide through the guide 34 inside the needle. In the preferred embodiment of the invention, as presented in FIG. 4, the rod cross section is rectangular and the hollow in the needle is about the same shape.

The rod is made of a tough enough material to resist pressure when gripping is performed and this material can be metal in order to obtain better electrical contacts, or it can be an insulating material, to get better accessibility and a better prevention against short-circuits.

The button 60 is made of an insulated material, such as plastic, has an inner part which is guided inside the sleeve and an outer end 62 to be pressed with the finger when gripping of the clip is to be prepared. The button has a limiter, in the preferred embodiment of the invention a shoulder 61, which acts in conjunction with a complementary sleeve limiter 21 in establishing the movements of the gripping unit 3.

The resilient device 4 biases the gripping ensemble inside the sleeve. The resilient device, in the preferred embodiment of the invention, is a metal spring.

Operation of the clip, to test and connect, will now be described in detail.

For using the test clip by direct point contact, the clip has to be held by keeping the sleeve in the hand and the tip 41 of the needle 40 is pressed against the desired point to be tested while the gripping ensemble is in the retracted position. For better handling, the sleeve 20 is provided with a finger grip 22 in the form of an annular flange, allowing single handed operation.

For the hands-free, hitch-on feature, the testing clip has to be fixed to the testing point. By pressing with the finger on the end 61, the button 60 is forced toward the sleeve 20, moving the gripping unit to the advanced position (FIG. 2). The hooked end of the rod is protruding from the guider 34 of the needle 40. The hook 51 is hooked onto the device to be tested and when the button 60 is released, the resilient device 4 presses between the button 60 and the support 30, gripping the tested device between the hook 51 and the needle 40, as seen in FIG. 3.

Figure 6:
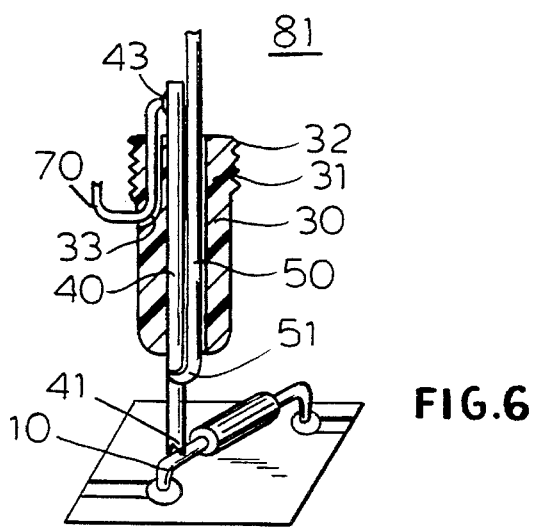
FIG. 6 is a cross-sectional view of the testing clip of FIG. 5 with the gripping ensemble in the retracted position.

In an alternative embodiment of the invention, shown in FIG. 5 and FIG. 6, the hollow guide 34 is inside the support 30, near and along the needle 40. The grip for the hands-free testing of the embodiment of FIG. 5 occurs at the release of the gripping ensemble from the advanced position. In FIG. 6 the rod 50 is in the retracted position and the needle 40 is free to perform the contact to the tested device 10.

In another embodiment of the invention, not presented in the drawing, two connecting wires, instead of one, are connected to the inside end of the needle, offering very low electrical resistance for specific two-wire electronic measurements.

Figure 7:
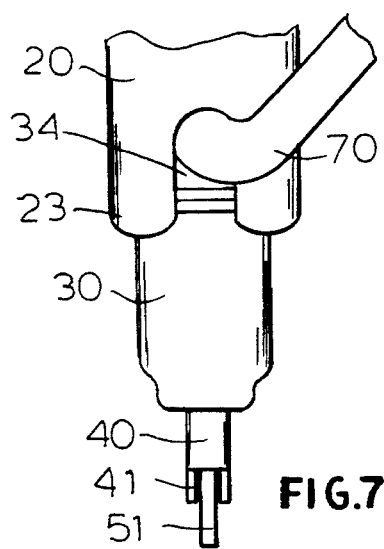
FIG. 7 is a view of another embodiment of the invention in the form of a shielded testing clip connected to a shielded wire.
Figure 8:
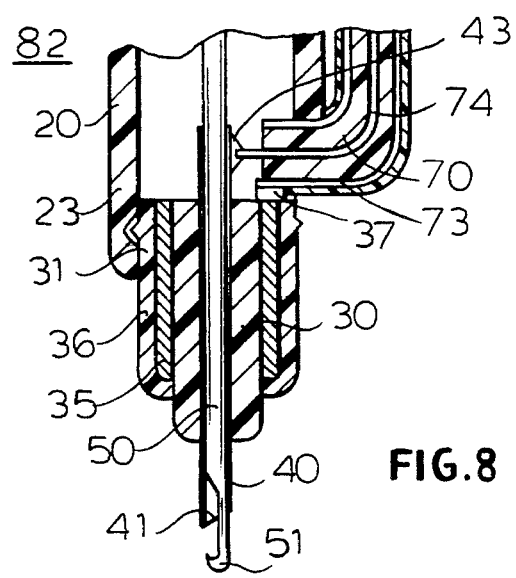
FIG. 8 is a longitudinal cross-sectional view of the testing clip from FIG. 7.

In another embodiment of the invention, shown in FIG. 7 and FIG. 8, the testing clip 82 is connected to a shielded wire 70 and the clip itself has a shielded testing needle, for improved performance on specific applications such as with high frequencies. The support 30 has an outer metal shield 35, and the coaxial wire 70 has the outer metal shield 73 electrically and mechanically connected to the shield 35, in this embodiment by soldering. The central cable 71 of the wire 70 is electrically and mechanically connected to the testing needle 40, in this embodiment of the invention by soldering.

In another embodiment of the invention, not presented in the drawing, the gripping ensemble comprises two rods fixed on the same button at one end, preferably with hooks opposing each other at the other end. The rods are guided inside the same guide and a better gripping by the clip can result.

Figure 10:
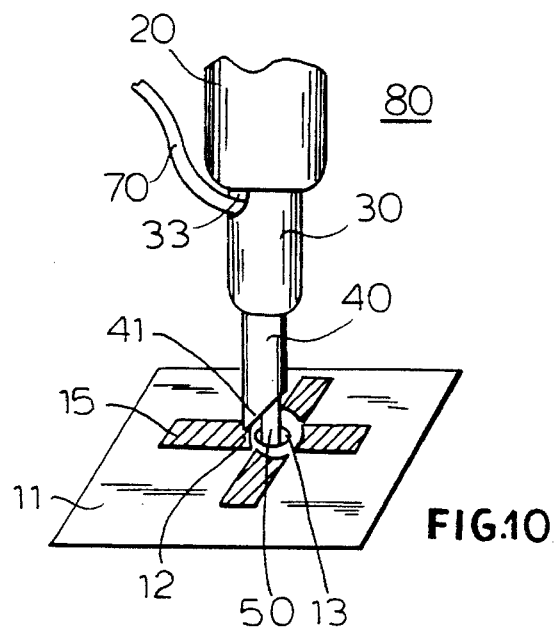
FIG. 10 is a view of a part of the testing clip hitched on for testing on the circuit board of FIG. 9.
Figure 11:
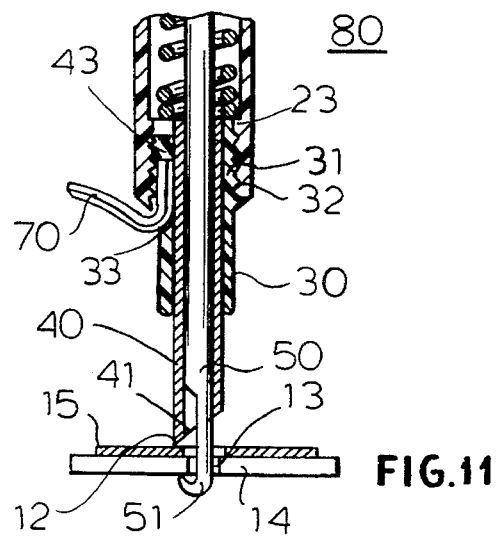
FIG. 11 is a longitudinal cross-sectional view of the devices of FIG. 10.

The testing clip has the possibility to make hitch-on, hands-free connections on the circuit boards, as shown in FIGS. 10 and 11. The circuit board 11 is provided with holes 13 and a metallic circuit path 15. The holes 13 have a shape and size to allow the passing of the rod 50 and the fastening of the clip on the board. Preferably, the hook 51 is then gripped on the edge 14 and the tip 51 of the needle 50 is pointed on the test point 12.

Figure 12:
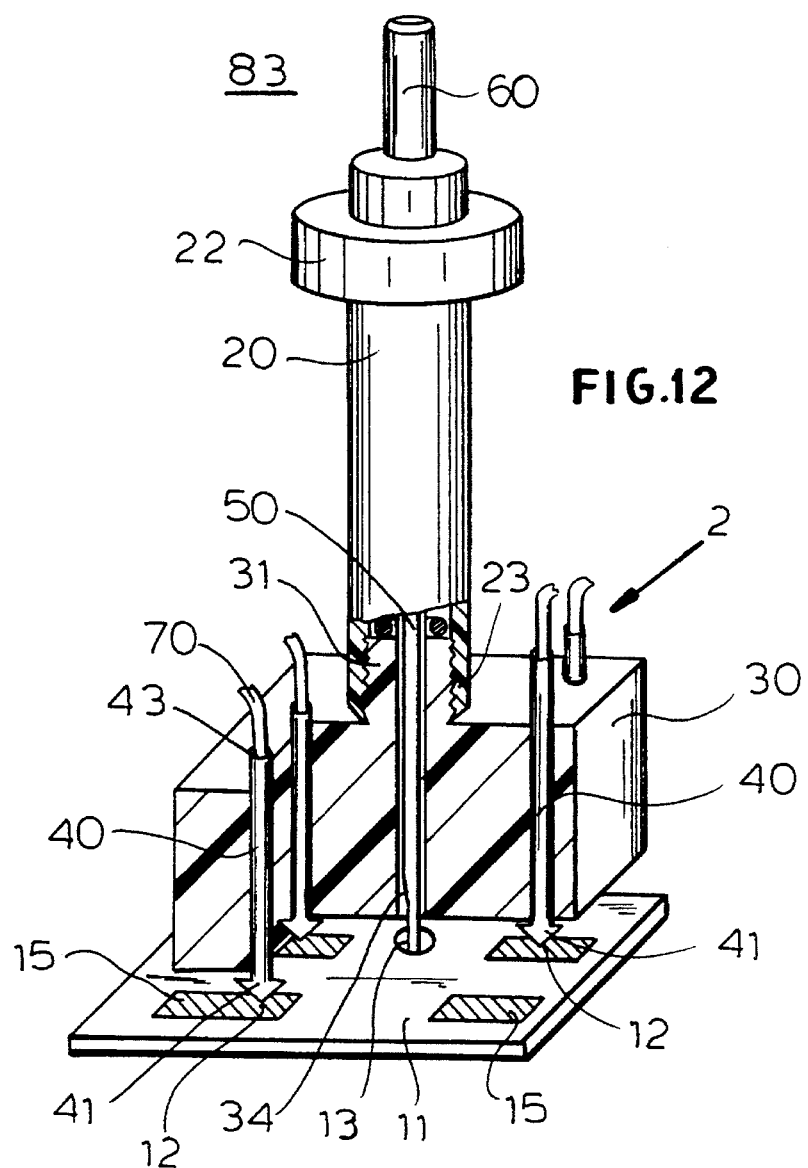
FIG. 12 is a partial cross-sectional view of another embodiment of the invention in the form of a testing clip with several testing needles connected to test points on a circuit board.
Figure 9:
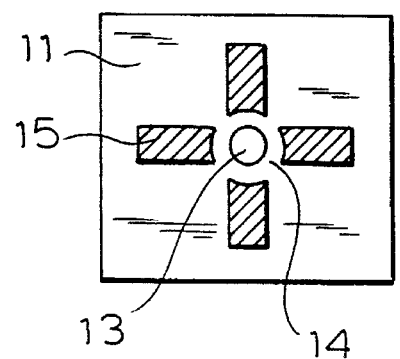
FIG. 9 is a view of a circuit board provided with a hole and test points for testing, according to the circuit board contacting method.
Figure 13:
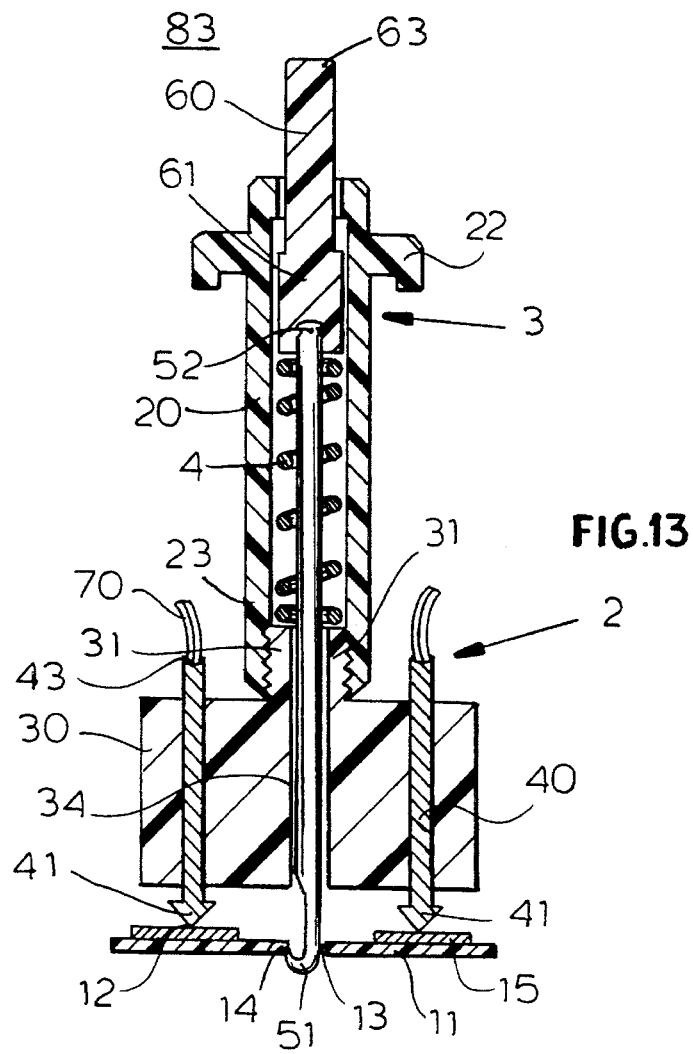
FIG. 13 is a cross-sectional view of the device of FIG. 11.

FIGS. 12 and 13 show another embodiment of the invention which can provide more than one contact on the circuit boards 11, specially provided for this method, as presented before, with holes 13 and a typical path of the circuit 15. The testing clip has several testing needles 40 fixed in the support 30. The needles have preferably a sharp tip 41 to provide reliable contacts and they are connected to the wires 70 by the connection 43. The clip is to be fastened onto the circuit board 11, by the rod 50, preferably by the hook 51 on the edges 14 of the hole 13 made in the circuit board. The clip assumes the position that brings the testing needles 40 to the contacting points 12 of the metallic circuit of the circuit board 11.

Figure 14:
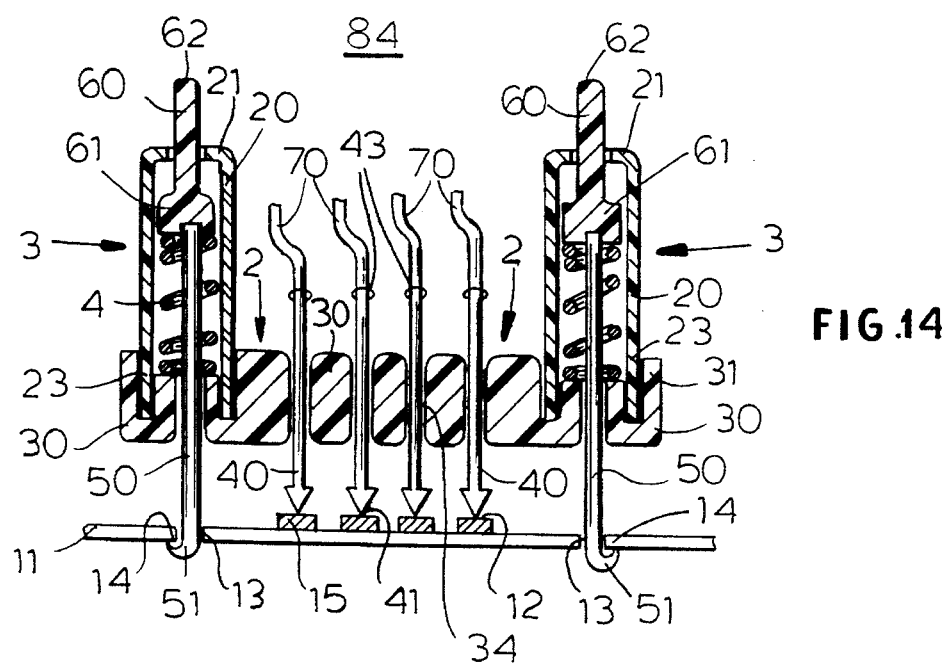
FIG. 14 is a cross-sectional view of another embodiment of the invention in the form of a testing clip with several testing needles and two gripping units, connected on a circuit board.

Another embodiment of the invention, presented in FIG. 14, has the ability to provide, by the same procedure, many connections to circuit boards and achieves good gripping on the circuit board using two gripping units.

I claim:

1. A test probe, comprising:

a handle formed by an electrically insulating elongated sleeve;

an electrically insulating tubular guide formed at one end of said sleeve;

a metallic test needle anchored in said guide and extending at most limitedly beyond said guide into said sleeve, said needle having a contact end projecting longitudinally from said guide and formed with a contact point for direct engagement with an electrical test connection by pressing of said needle thereagainst;

an insulated wire connected to said needle remote from said contact point, within said sleeve but proximal to said one end of said sleeve for electrical connection of the probe to test equipment;

a rod extending through said guide and longitudinally guided therein, said rod having a hook retractable toward said guide inwardly past said point into a retracted position and extendable outwardly past said point into an extended position upon displacement of said rod in said sleeve;

a button affixed to said rod in said sleeve, projecting axially from said sleeve at an opposite end thereof, and manually displaceable to retract and extend said hook, whereby said hook can engage a structure and hold said point against an electrical test connection; and resilient means in said sleeve biasing said button away from said guide and drawing said hook toward said retracted position.

2. The probe defined in claim 1 wherein said needle is tubular and said rod is guided in said needle.

3. The probe defined in claim 2 wherein said rod and said needle have generally rectangular cross sections.

4. The probe defined in claim 1 wherein said resilient means is a coil spring braced between said guide and said button.

5. The probe defined in claim 1 wherein said wire extends outwardly from said probe around said one end of said sleeve.

6. The probe defined in claim 1 wherein said wire is a coaxial conductor having a core connected to said needle and a shield connected to a shield extending around said guide.

* * * * *